United States Patent
Kim et al.

(10) Patent No.: US 10,468,250 B2
(45) Date of Patent: Nov. 5, 2019

(54) RINSE SOLUTION AND METHOD OF FABRICATING INTEGRATED CIRCUIT DEVICE BY USING THE SAME

(71) Applicant: Samsung Electronics Co., Ltd., Suwon-si, Gyeonggi-do (KR)

(72) Inventors: Ju-young Kim, Hwaseong-si (KR); Jeong-ju Park, Hwaseong-si (KR); Jin Park, Yongin-si (KR); Hai-sub Na, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 202 days.

(21) Appl. No.: 15/337,145

(22) Filed: Oct. 28, 2016

(65) Prior Publication Data
US 2017/0186615 A1    Jun. 29, 2017

(30) Foreign Application Priority Data

Dec. 23, 2015 (KR) .................. 10-2015-0185090

(51) Int. Cl.
| | |
|---|---|
| *G03F 7/40* | (2006.01) |
| *H01L 21/033* | (2006.01) |
| *C11D 1/00* | (2006.01) |
| *C11D 11/00* | (2006.01) |
| *H01L 21/027* | (2006.01) |
| *G03F 7/42* | (2006.01) |

(52) U.S. Cl.
CPC ............ *H01L 21/0337* (2013.01); *C11D 1/00* (2013.01); *C11D 11/0047* (2013.01); *G03F 7/42* (2013.01); *H01L 21/0274* (2013.01); *H01L 21/0332* (2013.01)

(58) Field of Classification Search
CPC .......... C11D 11/0047; C11D 1/00; G03F 7/42
USPC ....................................................... 510/176
See application file for complete search history.

(56) References Cited

U.S. PATENT DOCUMENTS

| | | | |
|---|---|---|---|
| 6,455,234 | B1 | 9/2002 | Lassila et al. |
| 7,214,474 | B2 | 5/2007 | Deng |
| 7,467,632 | B2 | 12/2008 | Lee et al. |
| 8,227,395 | B2 | 7/2012 | Zhang et al. |
| 2004/0204328 | A1* | 10/2004 | Zhang .................. G03F 7/0048 510/175 |
| 2006/0013780 | A1 | 1/2006 | Ford et al. |
| 2010/0248164 | A1 | 9/2010 | Kumagai et al. |
| 2014/0045335 | A1 | 2/2014 | Koh et al. |
| 2014/0234783 | A1 | 8/2014 | Wang et al. |

* cited by examiner

*Primary Examiner* — Daborah Chacko-Davis
(74) *Attorney, Agent, or Firm* — Lee & Morse, P.C.

(57) ABSTRACT

A rinse solution includes a surfactant and deionized water. The surfactant includes a compound having a branched structure, the compound having a branched structure including a hydrophobic group-containing main chain and a plurality of side chains that are branched from the main chain and have at least one hydrophilic functional group. A method of fabricating an integrated circuit device includes forming a photoresist pattern, followed by applying the rinse solution onto the photoresist pattern.

16 Claims, 19 Drawing Sheets

RINSE SOLUTION AND METHOD OF FABRICATING INTEGRATED CIRCUIT DEVICE BY USING THE SAME

CROSS-REFERENCE TO RELATED APPLICATION

Korean Patent Application No. 10-2015-0185090, filed on Dec. 23, 2015, in the Korean Intellectual Property Office, and entitled: "Rinse Solution and Method of Fabricating Integrated Circuit Device by Using the Same," is incorporated by reference herein in its entirety.

BACKGROUND

1. Field

Embodiments relate to a rinse solution and a method of fabricating an integrated circuit device by using the same, and more particularly, to a rinse solution including a surfactant, and to a method of fabricating an integrated circuit device by using the same.

2. Description of the Related Art

Along with size reduction and high integration of electronic devices, semiconductor devices require a faster operation speed, a lower operation voltage, and the like. To satisfy these requirements, the precision of shapes and sizes of patterns formed in the process of fabricating semiconductor devices may be strictly controlled.

SUMMARY

Embodiments are directed to a rinse solution, including a surfactant and deionized water. The surfactant includes a compound having a branched structure, the compound having a branched structure including a hydrophobic group-containing main chain and a plurality of side chains that are branched from the main chain and have at least one hydrophilic functional group.

Embodiments are also directed to a method of fabricating an integrated circuit device including forming a photoresist film on a substrate, exposing the photoresist film to light, forming a photoresist pattern by developing the photoresist film exposed to light, and rinsing the photoresist pattern by using a rinse solution that includes a surfactant including a compound having a branched structure, the compound having a branched structure including a hydrophobic group-containing main chain and a plurality of side chains that are branched from the main chain and have at least one hydrophilic functional group Embodiments are also directed to a method of fabricating an integrated circuit device, including forming a photoresist film on a substrate, forming a photoresist pattern having a hydrophilic sidewall by exposing the photoresist film to light and developing the photoresist film, first-rinsing the photoresist pattern by using deionized water, second-rinsing the photoresist pattern by applying a rinse solution onto the photoresist pattern, the rinse solution including a surfactant including a compound having a branched structure, the compound having a branched structure including a hydrophobic group-containing main chain and the plurality of side chains that are branched from the main chain and have at least one hydrophilic functional group, the at least one hydrophilic functional group in the plurality of side chains of the surfactant being chemically bondable to a hydrophilic sidewall of the photoresist pattern during the second-rinsing of the photoresist pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
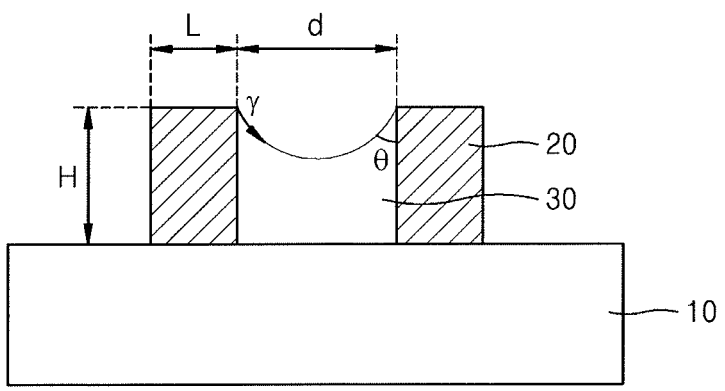
FIG. 1 illustrates a cross-sectional view for explaining a cause of collapse of a photoresist pattern due to a general rinse solution.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Expressions such as "at least one of," when preceding a list of elements, modify the entire list of elements and do not modify the individual elements of the list.

Unless otherwise provided, the term "substituted" indicates that a hydrogen atom of a named group is substituted with a substituent selected from among a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group, a carboxylate-containing group, a sulfonic acid group, a sulfonate-containing group, a phosphoric acid group, a phosphate-containing group, a C1 to C5 alkyl group, a C2 to C5 alkenyl group, a C2 to C5 alkynyl group, a C6 to C20 aryl group, a C7 to C20 arylalkyl group, a C1 to C4 alkoxy group, a C1 to C5 heteroalkyl group, a C3 to C20 heteroarylalkyl group, a C3 to C20 cycloalkyl group, a C3 to C15 cycloalkenyl group, a C6 to C15 cycloalkynyl group, a C2 to C15 heterocycloalkyl group, and combinations thereof.

As used herein, the term "C1 to C5 alkyl group" refers to linear or branched and substituted or unsubstituted alkyl groups having one to five carbon atoms. For example, the C1 to C5 alkyl group may be a methyl, ethyl, ethenyl, ethynyl, normal propyl (n-propyl), isopropyl, n-butyl, isobutyl, secondary butyl (sec-butyl), tertiary butyl (t-butyl), or n-pentyl group.

As used herein, the term "C3 to C20 cycloalkyl group" refers to alkyl groups including a cyclic group such as a cyclohexyl, cyclopentyl, or cyclopropyl group. The C3 to C20 cycloalkyl group may include linear or branched alkyl groups having one to six carbon atoms attached to the cyclic group.

As used herein, the term "C7 to C20 arylalkyl group" refers to a substituted or unsubstituted C7 to C20 hydrocarbon group including an aryl portion and an alkyl portion. For example, the aryl portion of the C7 to C20 arylalkyl group may be a phenyl, naphthyl, anthracenyl, phenanthrenyl, or fluorenyl group, and the alkyl portion may be a linear or branched alkyl group.

According to embodiments, a rinse solution includes a surfactant and deionized water. The surfactant includes a compound having a branched structure. The compound having a branched structure includes a hydrophobic group-containing main chain and a plurality of side chains, which are branched from the main chain and have at least one hydrophilic functional group.

In the rinse solution, the compound having a branched structure may be a compound represented by Formula 1:

[Formula 1]

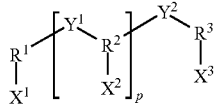

wherein each of $X^1$, $X^2$, and $X^3$ is a hydrophilic group;

$R^1$, $R^2$, and $R^3$ are each independently a substituted or unsubstituted C1 to C6 alkyl group-containing group, a substituted or unsubstituted C1 to C6 heteroalkyl group-containing group, a substituted or unsubstituted C2 to C6 alkenyl group-containing group, a substituted or unsubstituted C2 to C6 heteroalkenyl group-containing group, a substituted or unsubstituted C6 to C30 aryl group-containing group, a substituted or unsubstituted C6 to C30 heteroaryl group-containing group, a substituted or unsubstituted C2 to C20 alkynyl group-containing group, or a substituted or unsubstituted C2 to C20 heteroalkynyl group-containing group;

each of $Y^1$ and $Y^2$ is a C1 to C6 alkoxy group-containing group, a C1 to C6 alkylthio group-containing group, a C1 to C6 alkylcarbonylamino group-containing group, a hydroxyl group-containing group, a C1 to C6 alkyl group-containing group, a halogen atom, a C2 to C6 acyl group-containing group, a C2 to C6 acyloxy group-containing group, a C2 to C6 alkoxycarbonyl group-containing group, a C6 to C30 aryl group-containing group, a cyano group-containing group, or a nitro group-containing group; and p is an integer of 0 to 2.

In some embodiments, at least one of $R^1$, $R^2$, and $R^3$ in Formula 1 may be a fluorine-substituted hydrocarbon group.

In some embodiments, at least one of $R^1$, $R^2$, and $R^3$ in Formula 1 may include at least one heteroatom selected from among halogen atoms, O, N, P, S, B, and Si.

In some embodiments, each of $X^1$, $X^2$, and $X^3$ in Formula 1 may include an anionic hydrophilic group, a cationic hydrophilic group, a nonionic hydrophilic group, or combinations thereof.

In some embodiments, at least one of $X^1$, $X^2$, and $X^3$ in Formula 1 may include an anionic hydrophilic group selected from among sulfonate salts, sulfonic acid, carboxylate salts, carboxylic acid, phosphate salts, and phosphoric acid.

For example, at least one of $X^1$, $X^2$, and $X^3$ may include a structure selected from among structures represented by the following formulae.

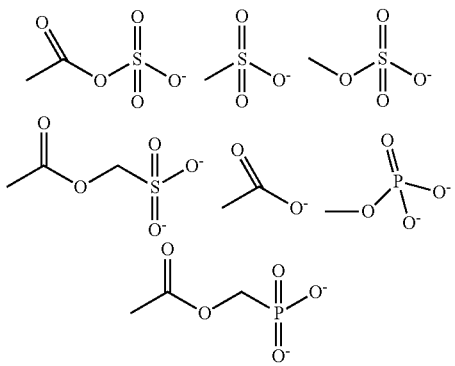

In some embodiments, at least one of $X^1$, $X^2$, and $X^3$ in Formula 1 may include a cationic hydrophilic group selected from among ammonium salts groups, amine salts groups, and cyclic amine salts groups.

For example, at least one of $X^1$, $X^2$, and $X^3$ may include a structure represented by the following formula:

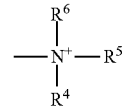

wherein $R^4$, $R^5$, and $R^6$ are each independently a hydrogen atom, a substituted or unsubstituted C1 to C6 alkyl group, a substituted or unsubstituted C1 to C6 heteroalkyl group, a substituted or unsubstituted C2 to C6 alkenyl group, a substituted or unsubstituted C2 to C6 heteroalkenyl group, a substituted or unsubstituted C6 to C30 aryl group, a substituted or unsubstituted C6 to C30 heteroaryl group, a substituted or unsubstituted C2 to C20 alkynyl group, or a substituted or unsubstituted C2 to C20 heteroalkynyl group.

In some embodiments, at least one of $R^4$, $R^5$, and $R^6$ may include at least one heteroatom selected from among halogen atoms, O, N, P, S, B, and Si.

In some embodiments, at least one of $X^1$, $X^2$, and $X^3$ in Formula 1 may include a cyclic amine group having a C4 to C6 ring.

In some embodiments, at least one of $X^1$, $X^2$, and $X^3$ in Formula 1 may include a nonionic hydrophilic group selected from among hydroxyl groups, ether groups, amine oxide groups, phosphine oxide groups, and sulfur oxide groups.

For example, at least one of $X^1$, $X^2$, and $X^3$ may include a structure selected from among structures represented by the following formulae:

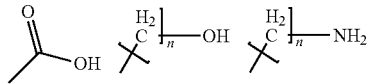

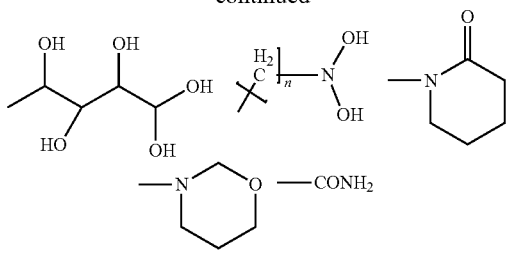

wherein n is an integer of 1 to 5.

In some embodiments, the surfactant included in the rinse solution may have a structure represented by Formula 2 or 3:

[Formula 2]

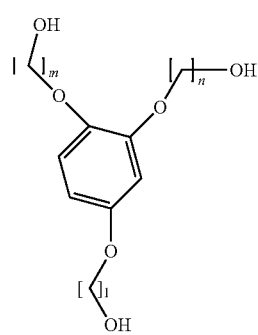

wherein each of l, m, and n is an integer of 1 to 5;

[Formula 3]

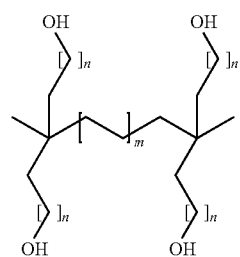

wherein m is 1 or 2, and n is an integer of 1 to 4.

In the rinse solution, the surfactant may be present in an amount of 100 ppm to 5,000 ppm based on the total amount of the rinse solution.

The rinse solution may further include at least one additive selected from among a trimming agent, a dissolution inhibitor, and a dispersant.

The trimming agent may improve surface roughness of a sidewall of a photoresist pattern. For example, the trimming agent may be tetrabutylammonium hydroxide (TBAH).

The dissolution inhibitor may prevent the surfactant from penetrating into the photoresist pattern by reacting with a surface of the photoresist pattern before the surfactant is adsorbed onto or chemically bonded to the surface of the photoresist pattern. In some embodiments, the dissolution inhibitor may be an amine. For example, the dissolution inhibitor may include monoethanolamine, diethanolamine, triethanolamine, or the like.

The dispersant may improve dispersion stability of the surfactant in the rinse solution by improving the solubility of the surfactant in the rinse solution. The dispersant may be, for example, ammonium hydroxide.

Each of the additives may be present in an amount of about 0.0001% by weight (wt %) to about 1 wt %, for example, about 0.0001 wt % to about 0.1 wt %, based on the total amount of the rinse solution.

As the size of a photoresist pattern that is used to form fine patterns for fabricating an integrated circuit device decreases, it becomes desirable to secure a process margin to avoid collapse of the photoresist pattern. For example, as a degree of integration of an integrated circuit device increases, although a line width of the photoresist pattern increasingly decreases, it is desirable to maintain a thickness of the photoresist pattern constant in order to etch an underlayer. Thus, an aspect ratio of the photoresist pattern increasingly increases, which increases the risk of a collapse of the photoresist pattern, which may be caused by capillary force due to surface tension of a rinse solution used for a photolithography process.

FIG. 1 illustrates a cross-sectional view for explaining a cause of collapse of a photoresist pattern due to a rinse solution.

Referring to FIG. 1, a plurality of photoresist patterns 20 may be formed on a substrate 10, followed by performing a rinse process of the resulting product in which the plurality of photoresist patterns 20 are formed. After the rinse process, a rinse solution 30 may remain in a space between two adjacent photoresist patterns 20 among the plurality of photoresist patterns 20. Here, if the rinse solution 30 includes only deionized water, the collapse of the photoresist patterns 20 may be caused by relatively high surface tension of deionized water.

Capillary force ($\sigma$) between the two adjacent photoresist patterns 20 may be represented by Equation 1:

$$\sigma = \frac{6\gamma\cos\theta}{d}\left(\frac{H}{L}\right)^2 \qquad \text{[Equation 1]}$$

wherein H is a height of the photoresist pattern 20; L is a line width of the photoresist pattern 20; d is a distance between the two adjacent photoresist patterns 20; $\gamma$ is surface tension of the rinse solution 30; $\theta$ is a contact angle between the photoresist pattern 20 and the rinse solution 30; and $\Sigma$ is a proportional constant.

Referring to Equation 1, the capillary force ($\sigma$) is proportional to the surface tension of the rinse solution 30. Thus, if the surface tension ($\gamma$) of the rinse solution 30 is reduced, the collapse of the photoresist patterns due to the capillary force ($\sigma$) may be prevented.

The rinse solution according to embodiments may include the surfactant in order to reduce the surface tension thereof. The rinse solution includes the surfactant in addition to deionized water, whereby the surface tension of the rinse solution may be reduced, and the collapse of the photoresist patterns may be prevented.

However, if a compound having a chemical structure that allows the compound to easily penetrate into the photoresist pattern were to be used as the surfactant, the surfactant could easily penetrate into the photoresist pattern in a rinse process. A surfactant that has penetrated into the photoresist pattern could remain inside the photoresist pattern without being removed from the photoresist pattern even after a drying process of the photoresist pattern. A bending phenomenon, in which the photoresist pattern is bent, could occur, and thus, poor patterns could result.

To prevent bending of the photoresist pattern after rinsing the photoresist pattern by developing a photoresist film, it is desirable to use a rinse solution containing a surfactant including a compound that has chemical properties that allow the compound to have high solubility with respect to water while having a chemical structure that inhibits the compound from penetrating into the photoresist pattern.

For example, after a photoresist pattern is formed by exposing a photoresist film to light and developing the photoresist film, the sidewall of the obtained photoresist pattern may have hydrophilicity. The rinse solution according to embodiments may include a surfactant having a chemical structure that can suppress penetration of the surfactant into the photoresist pattern. The surfactant may include the compound having a branched structure including the plurality of side chains that have hydrophilicity in order to strongly bond to a hydrophilic group exposed on the sidewall of the photoresist pattern. Hydrophilic groups in the plurality of side chains included in the surfactant may be chemically bonded to a plurality of sites of the hydrophilic sidewall of the photoresist film.

A mechanism by which the hydrophilic groups in the plurality of side chains of the surfactant included in the rinse solution according to embodiments are chemically bonded to a plurality of sites of the hydrophilic sidewall of the photoresist film, will be described in more detail with reference to FIGS. 2A and 2B.

Figure 2A:
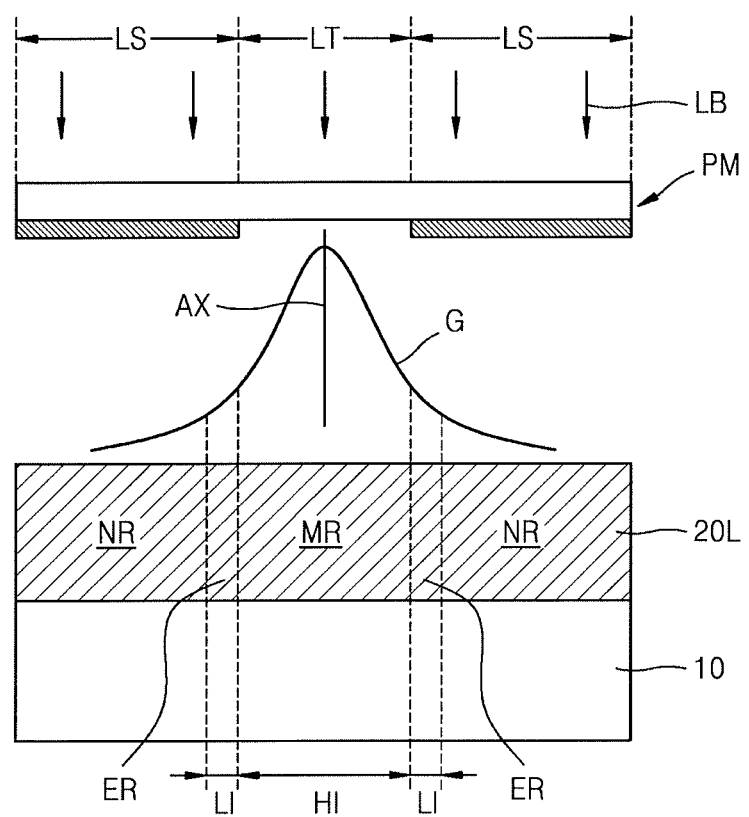
FIGS. 2A and 2B illustrate cross-sectional views for explaining a principle by which hydrophilic groups in a plurality of side chains of a surfactant included in a rinse solution according to embodiments chemically bond to a plurality of sites of a hydrophilic sidewall of a photoresist pattern.

Referring to FIG. 2A, a photoresist film 20L may be formed on a substrate 10, followed by exposing the photoresist film 20L to light. When the photoresist film 20L is exposed to light, a Gaussian beam may be irradiated onto the photoresist film 20L through a photomask PM having a light shielding area LS and a light transmitting area LT. As a result, a main exposed region MR, a non-exposed region NR, and an edge exposed region ER may be formed in the photoresist film 20L. The main exposed region MR is a region in which there is a sufficient polarity change of a material constituting the photoresist film 20L. The non-exposed region NR is a region in which there is no polarity change of the material constituting the photoresist film 20L. The edge exposed region ER is a region between the main exposed region MR and the non-exposed region NR in which the polarity change gradually decreases with increasing distance from the main exposed region MR to the non-exposed region NR.

In the process of exposing the photoresist film 20L to light, when a light beam LB from a light source such as an excimer laser is irradiated onto the substrate 10 through the photomask PM, the light beam LB may be axially symmetric with respect to an optical axis AX and a density distribution of the light beam LB may be a Gaussian distribution as denoted by G. Thus, an intensity of the light beam may sharply decrease with increasing distance from the optical axis AX.

Therefore, only the main exposed region MR of the photoresist film 20L, which corresponds to a high intensity portion HI having a relatively high intensity among the Gaussian beam, may have a sufficient polarity change to be able to be substantially developed by a positive tone developer. On the other hand, in the edge exposed region ER of the photoresist film 20L, which corresponds to a low intensity portion LI having a relatively low intensity among the Gaussian beam, although a small amount of acid may be generated from a photoacid generator (PAG) in the photoresist film 20L by the exposure light, the amount of acid generated may not be sufficient. When there is an insufficient polarity change of a polymer constituting the photoresist film 20L, the edge exposed region ER of the photoresist film 20L may not be developed by a positive tone developer. In addition, since the non-exposed region NR of the photoresist film 20L is not exposed to light, the non-exposed region NR has no substantial polarity change. The edge exposed region ER, located between the main exposed region MR and the non-exposed region NR, may have a polarity change that gradually decreases with increasing distance from the main exposed region MR to the non-exposed region NR.

In the edge exposed region ER, a relatively small amount of acid may be generated from the PAG in the photoresist film 20L by the exposure process. Some acid-labile protecting groups bonded to the polymer may be deprotected by the small amount of acid generated. As a result, in the polymers included in the photoresist film 20L, hydrophilic groups such as carboxyl groups may be increased in proportion to the amount of the deprotected acid-labile protecting groups.

Figure 2B:
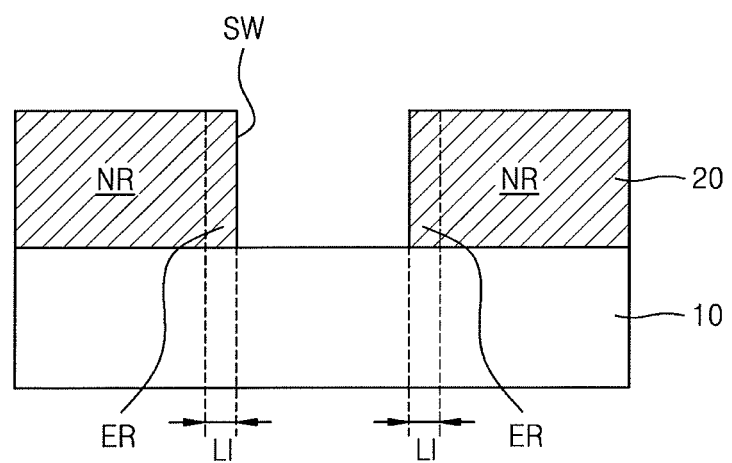

Referring to FIG. 2B, the main exposed region MR of the photoresist film 20L may be removed by developing the exposed photoresist film 20L, thereby forming a photoresist pattern 20.

The edge exposed region ER may be exposed on a sidewall SW of the photoresist pattern 20. In the edge exposed region ER exposed on the sidewall SW, some of the acid-labile protecting groups bonded to the polymer may be deprotected by the small amount of acid generated upon the exposure process. As a result, hydrophilic groups such as carboxyl groups constituting side chain groups of the polymer may be exposed.

The surfactant included in the rinse solution according to embodiments includes a plurality of side chains. Hydrophilic groups respectively included in the plurality of side chains may form chemical bonds such as hydrogen bonds or ionic bonds with hydrophilic groups, such as carboxyl groups, exposed on the sidewall SW of the photoresist pattern 20.

An inner part of the photoresist pattern 20 that is not exposed to the rinse solution corresponds to the non-exposed region NR. The non-exposed region NR has hydrophobicity stronger than that of the edge exposed region ER. For this reason, hydrophobic groups included in the main chain of the surfactant, which has the hydrophilic groups chemically bonded to or adsorbed onto the sidewall SW of the photoresist pattern 20, may have affinity with respect to hydrophobic groups of the inner part of the photoresist pattern 20. As a comparative example, if the surfactant were to have a chemical structure in which hydrophobic groups and hydrophilic groups are connected to each other in a linear chain shape, after the hydrophilic groups of the surfactant are chemically bonded to or adsorbed onto the sidewall SW of the photoresist pattern 20, the surfactant could deeply penetrate into the photoresist pattern 20 due to the affinity between the hydrophobic groups of the surfactant and the hydrophobic groups inside the photoresist pattern 20, such that strong bonds between the hydrophobic groups could be formed inside the photoresist pattern 20. In this case, the surfactant that has penetrated into the photoresist pattern 20 could remain inside the photoresist pattern 20 without being removed from the photoresist pattern 20. As a result, defects such as bending of the photoresist pattern 20 could be caused.

However, the surfactant included in the rinse solution according to embodiments has a chemical structure by which penetration of the surfactant into the photoresist pattern may be suppressed. For example, the surfactant may include the compound having a branched structure including the plurality of side chains which have the hydrophilic groups, in order to strongly bond to the hydrophilic groups exposed on the sidewall of the photoresist pattern. Thus, the hydrophilic groups in the side chains of the surfactant may be chemically bonded to or adsorbed onto a plurality of sites of the hydrophilic sidewall of the photoresist pattern. Therefore, when the rinse solution including the surfactant, which includes the compound having a branched structure including the plurality of side chains having the hydrophilic groups, is applied onto the photoresist pattern, the hydrophilic groups in the side chains included in the surfactant may be strongly chemically bonded to or adsorbed onto the hydrophilic sidewall of the photoresist pattern, and the hydrophobic groups included in the main chain of the surfactant can be kept spaced apart from the photoresist pattern, with the hydrophilic functional groups in the side chains included in the surfactant being between the main chain and the photoresist pattern. Therefore, issues that could result from the surfactant penetrating into the photoresist pattern and remaining inside the photoresist pattern in the process of rinsing the photoresist pattern, for example, issues of bending of the photoresist pattern may be prevented, thereby suppressing deformation and collapse of the pattern and suppressing CD (critical dimension) change of the pattern caused by the deformation and collapse.

Figure 3:
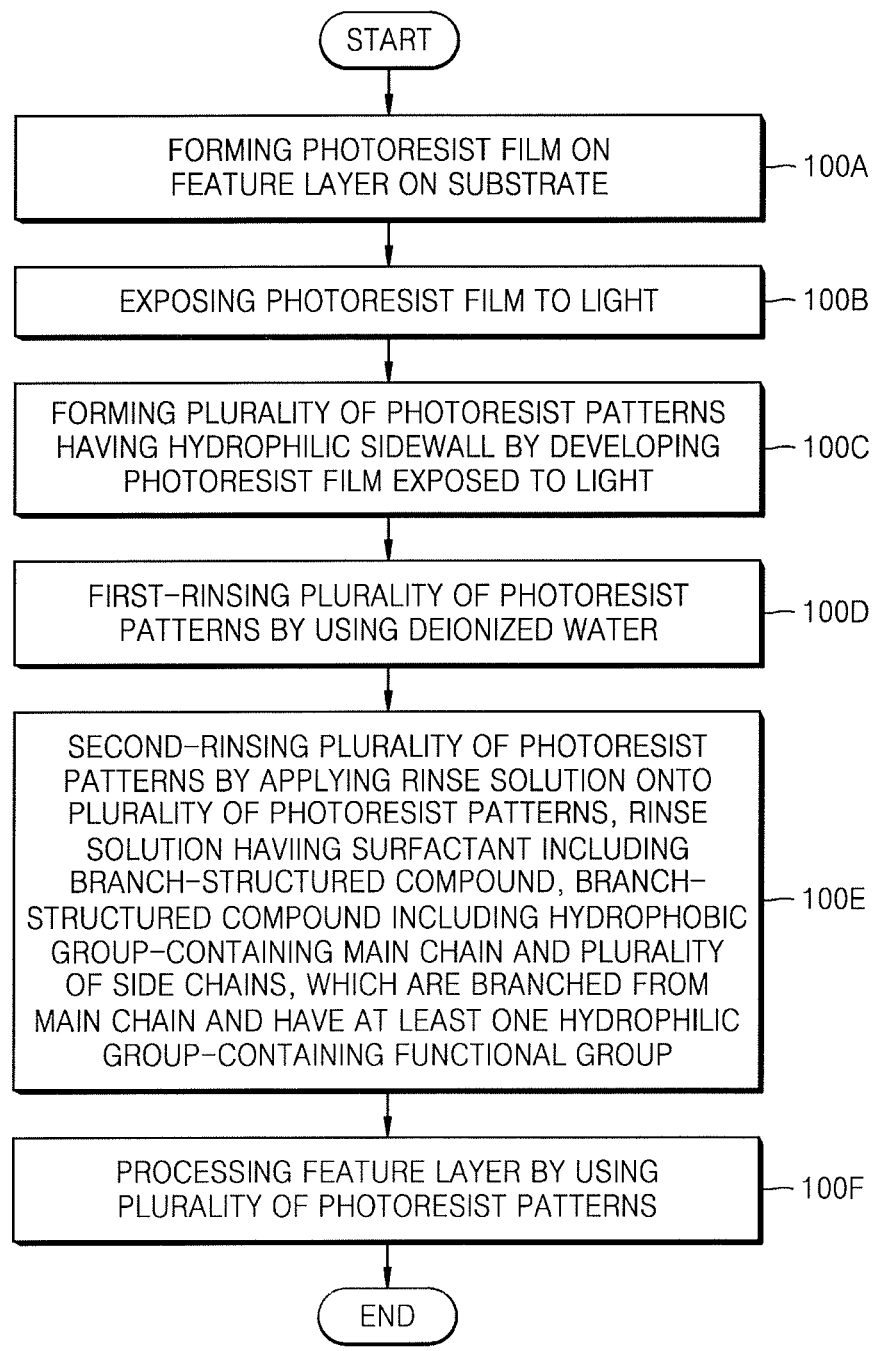
FIG. 3 illustrates a flowchart of procedures of a method of fabricating an integrated circuit device according to embodiments.

FIG. 3 is a flowchart of procedures of a method of fabricating an integrated circuit device according to embodiments.

Figure 4A:
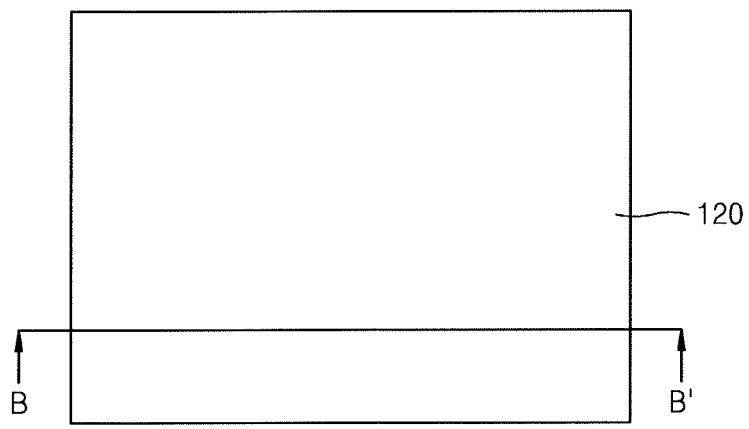
FIGS. 4A to 10B illustrate diagrams for explaining stages of a method of fabricating an integrated circuit device according to embodiments, FIGS. 4A, 5A, . . . , and 10A are respectively plan views shown according to a process order of the method of fabricating an integrated circuit device, and FIGS. 4B, 5B, . . . , and 10B are respectively cross-sectional views taken along lines B-B' of FIGS. 4A, 5A, . . . , and 10A.

FIGS. 4A to 10B illustrate stages of a method of forming line and space patterns by using a method of fabricating an integrated circuit device according to embodiments. FIGS. 4A, 5A, ..., and 10A respectively illustrate plan views according to a process order of the method of fabricating the integrated circuit device, and FIGS. 4B, 5B, ..., and 10B respectively illustrate cross-sectional views taken along lines B-B' of FIGS. 4A, 5A, ..., and 10A.

The method of fabricating the integrated circuit device according to embodiments will be described in detail with reference to FIGS. 3 and 4A to 10B.

In a process 100A of FIG. 3, a photoresist film is formed on a feature layer on a substrate.

Figure 4B:
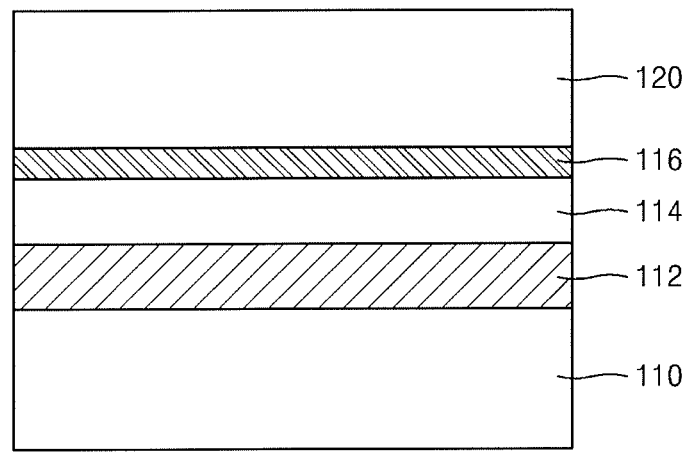

To perform the process 100A of FIG. 3, as shown in FIGS. 4A and 4B, a feature layer 112 and a hard mask layer 114 may be sequentially formed on a substrate 110, and an anti-reflective film 116 and a photoresist film 120 may be sequentially formed on the hard mask layer 114.

The substrate 110 may include a semiconductor substrate. In some embodiments, the substrate 110 may include a semiconductor such as Si or Ge. In some embodiments, the substrate 110 may include a compound semiconductor such as SiGe, SiC, GaAs, InAs, or InP. In some embodiments, the substrate 110 may have a silicon on insulator (SOI) structure. The substrate 110 may include a conductive region, for example, an impurity-doped well, or an impurity-doped structure. In addition, the substrate 110 may include various device isolation structures such as a shallow trench isolation (STI) structure.

The feature layer 112 may be an insulating film or a conductive film. For example, the feature layer 112 may include a metal, an alloy, a metal carbide, a metal nitride, a metal oxynitride, a metal oxycarbide, a semiconductor, polysilicon, an oxide, a nitride, an oxynitride, a hydrocarbon compound, or combinations thereof, as examples. If a pattern finally intended to be formed is to be formed on the substrate 110, the feature layer 112 may be omitted.

The hard mask layer 114 may include various films depending upon the type of the feature layer 112. For example, the hard mask layer 114 may include an oxide film, a nitride film, a SiCN film, a polysilicon film, an amorphous carbon layer (ACL), or a carbon-containing film such as spin-on hardmask (SOH) material. The carbon-containing film including the SOH material may include an organic compound in which carbon is present in a relatively high amount of about 85 wt % to about 99 wt % based on a total amount of the organic compound. The organic compound may include an aromatic ring-containing hydrocarbon compound such as benzene or naphthalene, or derivatives thereof.

The anti-reflective film 116 may include an inorganic anti-reflective film, an organic anti-reflective film, or combinations thereof.

The photoresist film 120 may be a film obtained from a photoresist composition. The photoresist composition may include a polymer capable of having a polarity change by an action of an acid. The photoresist composition may include a chemically amplified photoresist including a photosensitive polymer, PAG, a solvent, or the like, the photosensitive polymer including an acid-labile group. In some embodiments, the photosensitive polymer may include a (meth) acrylate polymer. The photosensitive polymer may include an acid-labile protecting group.

The photoresist film 120 may be a resist for a KrF excimer laser (248 nm), a resist for a ArF excimer laser (193 nm), a resist for a $F_2$ excimer laser (157 nm), or a resist for an extreme ultraviolet laser (EUV, 13.5 nm). The photoresist film 120 may be formed by using spin coating, spray coating, dip coating, or the like. The photoresist film 120 may have a thickness of about 300 Å to about 1,500 Å. The photoresist film 120 may be subjected to a soft bake process at a temperature of about 80° C. to about 130° C. for about 40 seconds to about 100 seconds.

In a process 100B of FIG. 3, the photoresist film may be exposed to light.

Figure 5A:
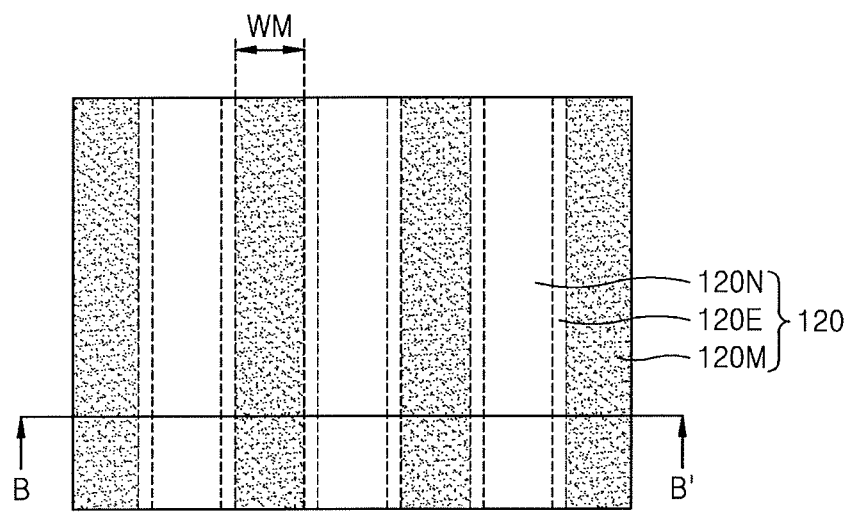
Figure 5B:
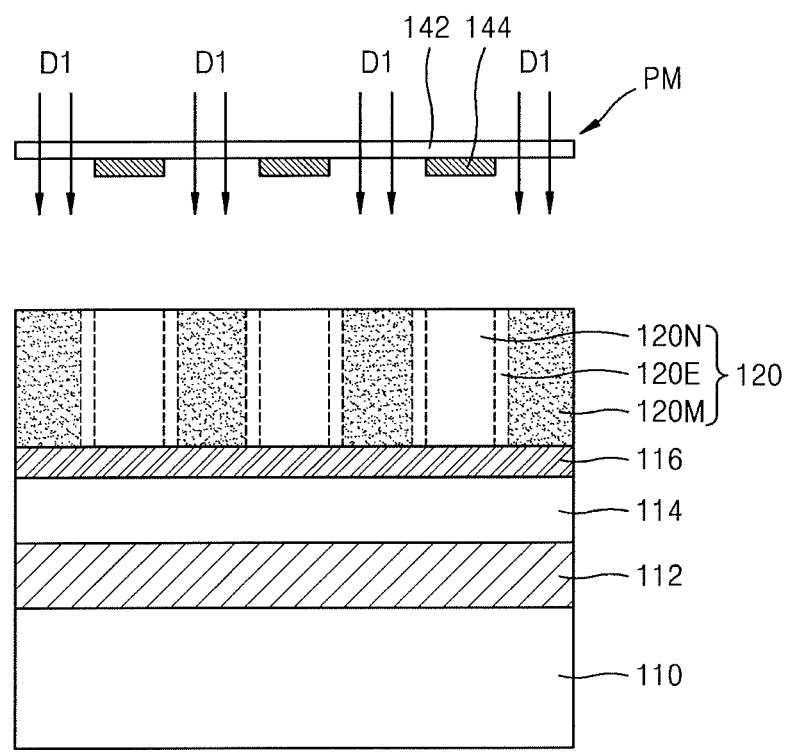

To perform the process 100B of FIG. 3, as shown in FIGS. 5A and 5B, a photomask PM having a plurality of light transmitting areas and a plurality of light shielding areas may be aligned at a specific location over the substrate 110, and the photoresist film 120 may be exposed to light at a specific dose D1 through the plurality of light transmitting areas. By the exposure, a main exposed region 120M having a sufficient polarity change to be removed by a positive tone developer, a non-exposed region 120N having no polarity change, and an edge exposed region 120E, which has a polarity change that gradually decreases with increasing distance from the main exposed region 120M to the non-exposed region 120N while being located between the main exposed region 120M and the non-exposed region 120N, may be formed in the photoresist film 120.

Details of the main exposed region 120M, the non-exposed region 120N, and the edge exposed region 120E are the same as the descriptions of the main exposed region MR, the non-exposed region NR, and the edge exposed region ER, the descriptions having been made with reference to FIG. 2A.

The photomask PM may include a transparent substrate 142. A plurality of light shielding patterns 144 may be formed on the transparent substrate 142. The transparent substrate 142 may include quartz. The plurality of light shielding patterns 144 may include chromium (Cr). The plurality of light shielding patterns 144 may include line patterns arranged parallel to each other.

In the process of exposing the photoresist film to light according to the process 100B of FIG. 3, irradiation light having various wavelengths may be used. For example, the exposure process may be performed by using light having a wavelength of i-line (365 nm), 248 nm, 193 nm, EUV (13.5 nm), or 157 nm. In some embodiments, when light having a wavelength of 193 nm is used, an immersion lithograph process may be used. When the immersion lithograph process is used, in order to prevent direct contact between an immersion liquid and the photoresist film 120 and to prevent components of the photoresist film 120 from being leached into the immersion liquid, a topcoat layer covering the photoresist film 120 may be further formed before the exposure process. In some embodiments, even though the immersion lithograph process is used, the photoresist film 120 may include a fluorine-containing additive, and the topcoat layer may be omitted.

The dose D1 may be set according to a width WM of the main exposed region 120M intended to be formed in the photoresist film 120 through the exposure process. As the width WM of the main exposed region 120M intended to be formed decreases, a set value of the dose D1 may be decreased. In addition, as the width WM of the main exposed region 120M increases, the set value of the dose D1 may be increased.

In a process 100C of FIG. 3, a plurality of photoresist patterns having a hydrophilic sidewall may be formed by developing the photoresist film exposed to light.

Figure 6A:
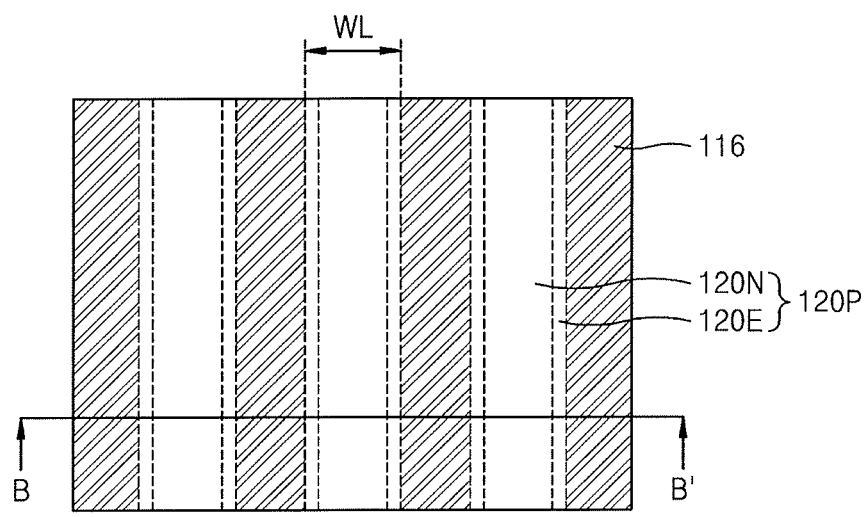
Figure 6B:
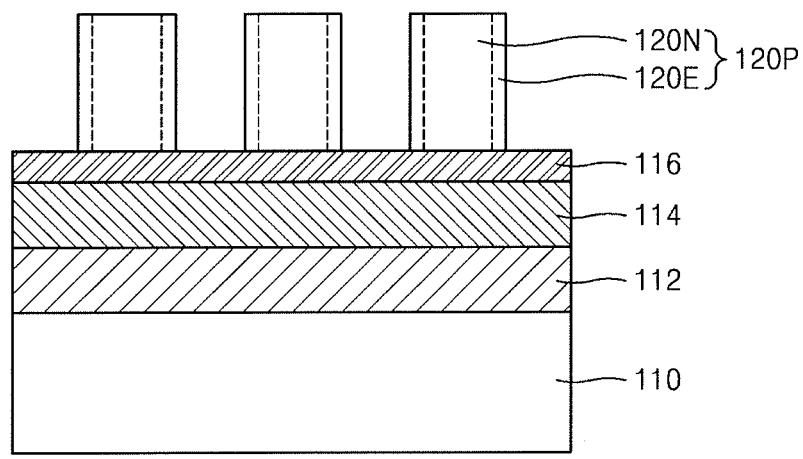

To perform the process 100C of FIG. 3, as shown in FIGS. 6A and 6B, the photoresist film 120 may be developed by using a developer, thereby removing the main exposed region 120M (see FIGS. 5A and 5B). As a result, a plurality of photoresist patterns 120P having sidewalls exposing the edge exposed region 120E may be formed.

The plurality of photoresist patterns 120P may have various shapes. For example, each of the photoresist patterns 120P may have a line shape as shown in FIG. 6A. The photoresist patterns 120P may have a constant width WL along the length direction, in a plan view. In other implementations, the plurality of photoresist patterns 120P may have various other shapes such as a curved shape and a zigzag shape, and may have a varying width along the length direction. In other implementations, a photoresist pattern having a plurality of through-holes exposing the anti-reflective film 116 may be formed instead of the plurality of photoresist patterns 120P.

The developer may include a positive tone developer. In some embodiments, the developer may include a basic aqueous solution. For example, the developer may include a tetramethylammonium hydroxide (TMAH) solution. The TMAH solution may have a concentration of about 2 wt % to about 5 wt %. For example, to form the photoresist patterns 120P, the photoresist film 120 exposed to light may be developed for about 10 seconds to about 100 seconds by using the TMAH solution.

After the photoresist patterns 120P are formed, the anti-reflective film 116 may be exposed between the plurality of photoresist patterns 120P.

In a process 100D of FIG. 3, the plurality of photoresist patterns may be subjected to a first rinse using deionized water.

Figure 7A:
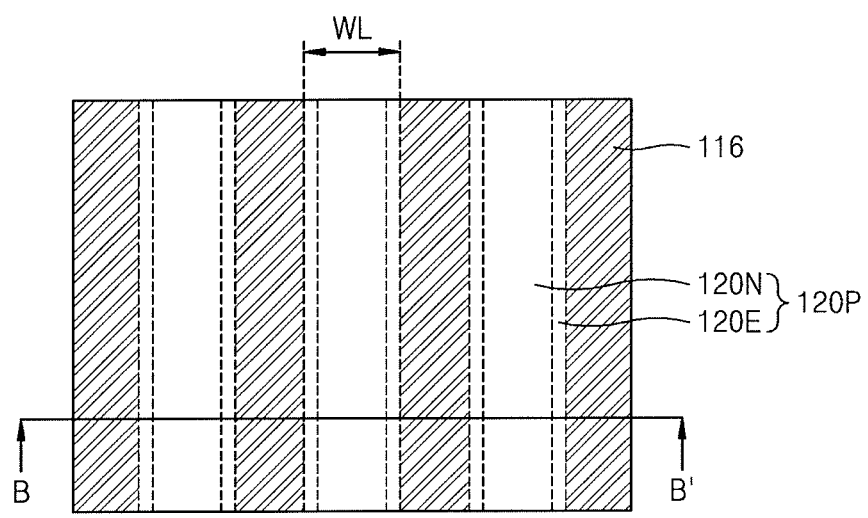
Figure 7B:
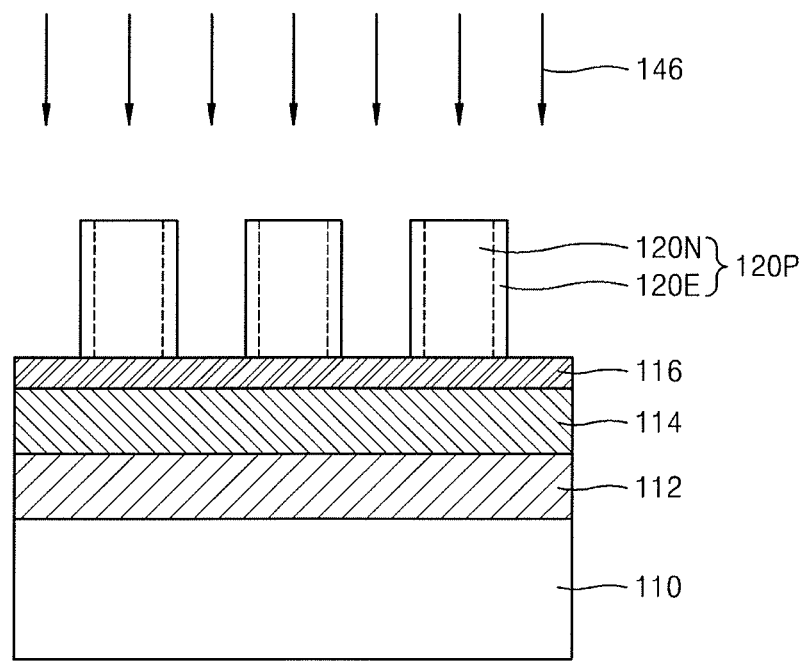

For example, as shown in FIGS. 7A and 7B, the product including the plurality of photoresist patterns 120P resulting from developing the photoresist film 120 may be subjected to a first rinse using deionized water 146.

The first rinse process using the deionized water 146 may be performed at room temperature.

In the first rinse process, the deionized water 146 may be brought into contact with the plurality of photoresist patterns 120P by applying the deionized water 146 onto an upper surface of the substrate 110, on which the plurality of photoresist patterns 120P are formed, by spray, spin coating, or dipping. For example, the deionized water 146 may be brought into contact with the plurality of photoresist patterns 120P for about 1 second to about 30 seconds. While the deionized water 146 is applied, the substrate 110 on which the plurality of photoresist patterns 120P are formed may be rotated in a specific direction at a speed of about 200 rpm to about 2000 rpm.

In a process 100E of FIG. 3, the plurality of photoresist patterns may be subjected to second rinse by applying the rinse solution according to embodiments onto the plurality of photoresist patterns.

Figure 8A:
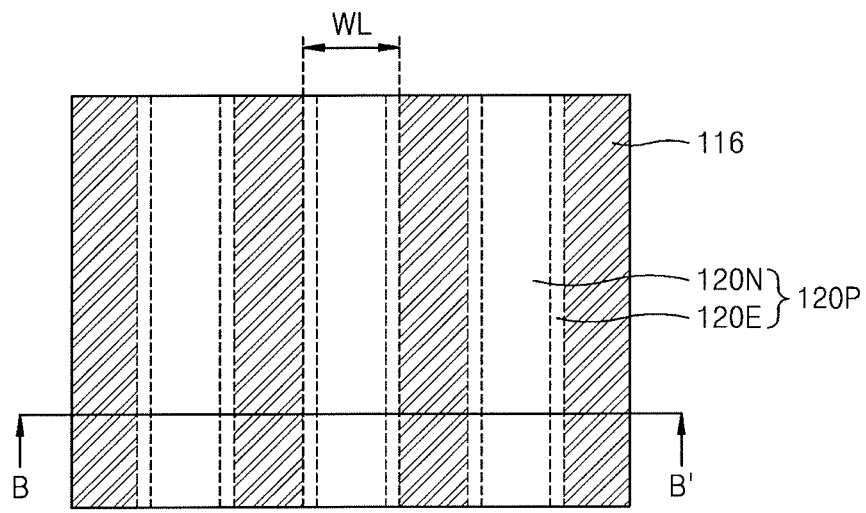
Figure 8B:
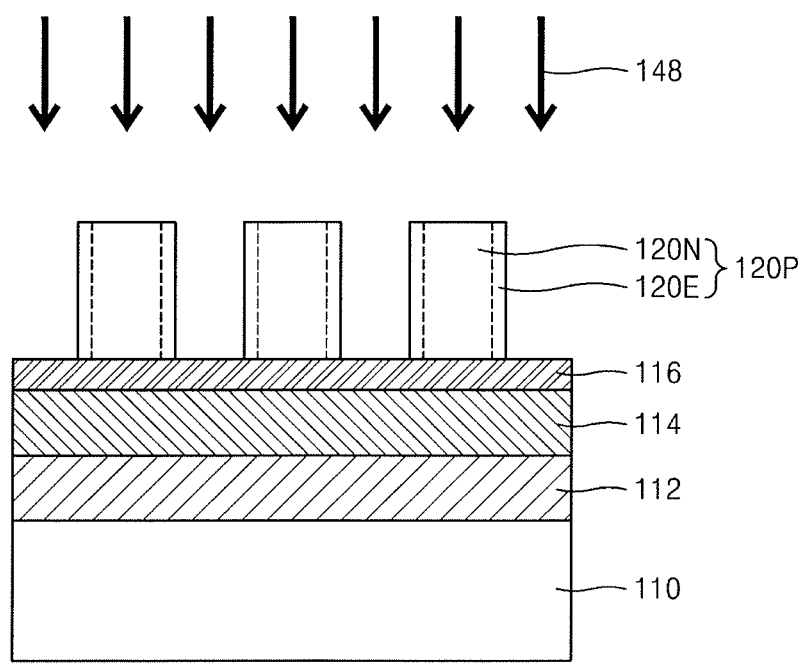

As shown in FIGS. 8A and 8B, a rinse solution 148 according to embodiments may be applied onto the plurality of photoresist patterns 120P.

As described above, the rinse solution 148 may include the surfactant including the compound having a branched structure (branch-structured compound) that includes the hydrophobic group-containing main chain and the plurality of side chains, the plurality of side chains being branched from the main chain and having the at least one hydrophilic functional group.

In some embodiments, the rinse solution 148 may include the surfactant having the chemical structure represented by Formula 1 as set forth above, and deionized water. The surfactant may be present in an amount of about 100 ppm to about 5,000 ppm in the rinse solution 148, based on the total amount of the rinse solution 148.

In some other embodiments, the rinse solution 148 may include the surfactant having the chemical structure represented by Formula 1 as set forth above, deionized water, and an additive. The additive may include at least one of a trimming agent, a dissolution inhibitor, and a dispersant. In some embodiments, the additive may include TBAH, an amine, ammonium hydroxide, or combinations thereof.

Without being bound to a particular theory, it is believed that while the second rinse process is performed such that the rinse solution 148 is applied onto the plurality of photoresist patterns 120P, the hydrophilic functional groups in the plurality of side chains included in the surfactant may be chemically bonded to the hydrophilic sidewalls of the plurality of photoresist patterns 120P. While the second rinse process is performed, the hydrophilic functional groups in the plurality of side chains included in the surfactant may be chemically bonded to hydrophilic groups exposed on the sidewalls of the plurality of photoresist patterns 120P, such that the surfactant is strongly adsorbed onto the sidewalls of the photoresist patterns 120P. As a result, the hydrophobic group-containing main chain of the surfactant may be kept spaced apart from the photoresist patterns 120P, with the hydrophilic functional groups in the plurality of side chains included in the surfactant being between the main chain and the photoresist patterns 120P.

The second rinse process using the rinse solution 148 may be performed at room temperature.

In the second rinse process, the rinse solution 148 may be brought into contact with the plurality of photoresist patterns 120P by applying the rinse solution 148 onto the upper surface of the substrate 110, on which the plurality of photoresist patterns 120P are formed, in the manner of spray, spin coating, or dipping. The rinse solution 148 may be brought into contact with the plurality of photoresist patterns 120P for about 1 second to about 30 seconds, for example. While the rinse solution 148 is applied, the substrate 110, on which the plurality of photoresist patterns 120P are formed, may be rotated in a specific direction at a speed of about 200 rpm to about 2,000 rpm.

In a process 100F of FIG. 3, the feature layer may be processed by using the plurality of photoresist patterns.

Figure 9A:
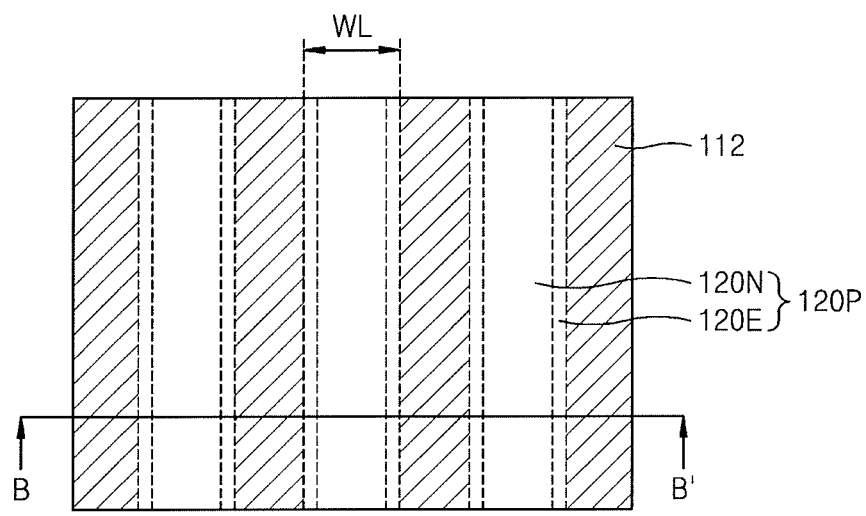
Figure 9B:
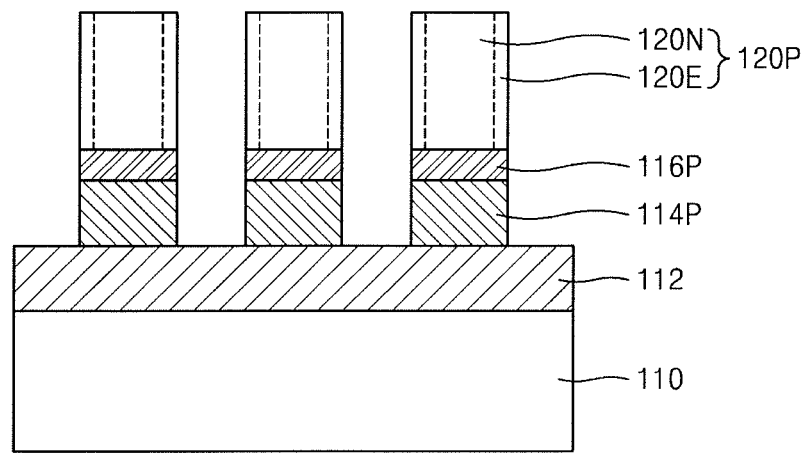
Figure 10A:
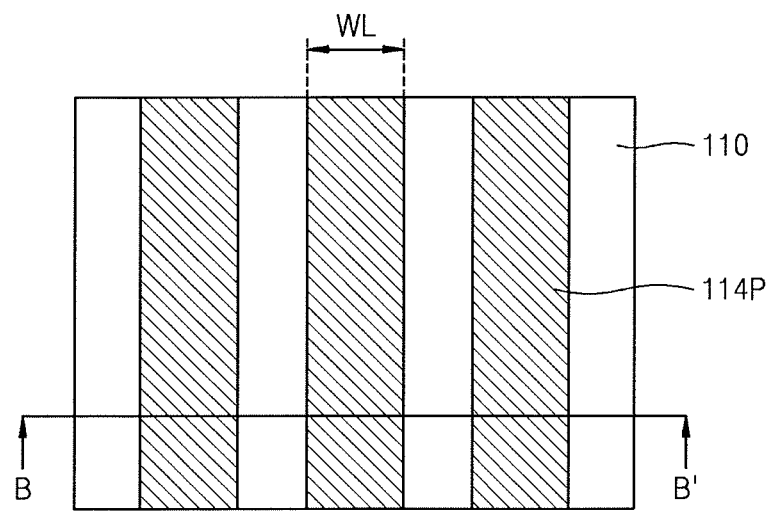
Figure 10B:
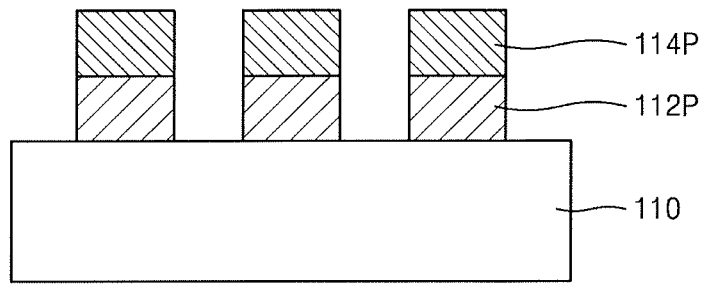

To perform the process 100F of FIG. 3, a process shown in FIGS. 9A and 9B, and a process shown in FIGS. 10A and 10B may be sequentially performed.

First, referring to FIGS. 9A and 9B, the anti-reflective film 116 and the hardmask layer 114 may be etched by using the plurality of photoresist patterns 120P as an etch mask, thereby forming an anti-reflective film pattern 116P and a hardmask pattern 114P.

Referring to FIGS. 10A and 10B, unnecessary films on the hardmask pattern 114P may be removed, followed by etching the feature layer 112 by using the hardmask pattern 114P as an etch mask, thereby forming a plurality of feature patterns 112P.

Next, the hardmask pattern 114P remaining on the plurality of feature patterns 112P may be removed, as desired, followed by performing a desired process for forming a device.

In some other embodiments, to process the feature layer according to the process 100F of FIG. 3, impurity ions may be implanted into the feature layer 112 by using the photoresist patterns 120P formed in the process of FIGS. 8A and 8B as an ion implantation mask. In this case, the hardmask layer 114 may be omitted.

In some further embodiments, to process the feature layer according to the process 100F of FIG. 3, as in the process of FIGS. 9A and 9B, a separate process film may be formed on the feature layer 112 exposed by the hardmask pattern 114P. The process film may include a conductive film, an insulating film, a semiconductor film, or combinations thereof.

Figure 11:
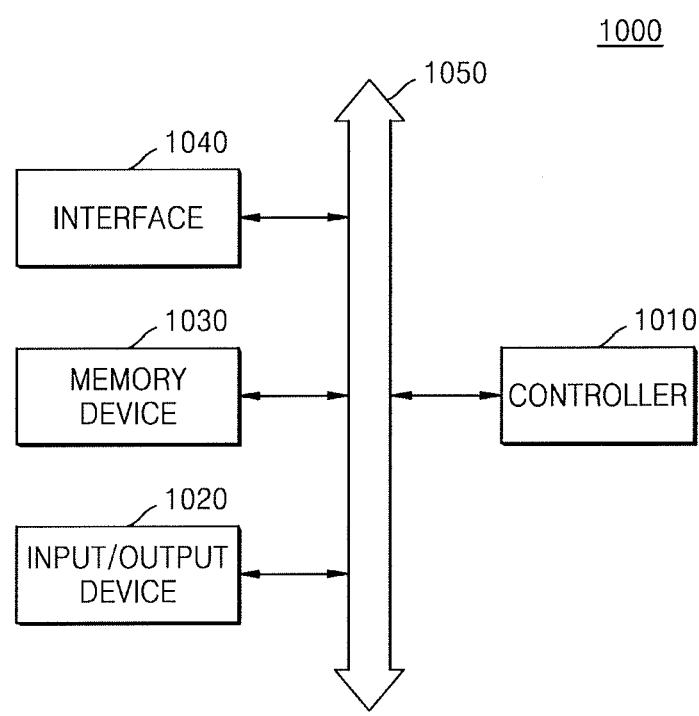
FIG. 11 illustrates a block diagram of a system including an integrated circuit device according to embodiments.

FIG. 11 is a block diagram of a system 1000 including an integrated circuit device according to the inventive concept.

The system 1000 includes a controller 1010, an input/output device 1020, a memory device 1030, and an interface 1040. The system 1000 may be a mobile system, or a system transmitting or receiving information. In some embodiments, the mobile system may be a personal digital assistant (PDA), a portable computer, a web tablet, a wireless phone, a mobile phone, a digital music player, or a memory card. The controller 1010 is for controlling a program executed in the system 1000, and may include a microprocessor, a digital signal processor, a microcontroller, or a device similar thereto. The input/output device 1020 may be used for data input and output of the system 1000. The system 1000 may be connected to devices external to the system 1000, for example, a personal computer or a network by using the input/output device 1020, and may exchange data with the external devices. The input/output device 1020 may be, for example, a keypad, a keyboard, or a display.

The memory device 1030 may store codes and/or data for operations of the controller 1010, or may store data processed by the controller 1010. The memory device 1030 may include at least one integrated circuit device obtained by the method of fabricating the integrated circuit device according to embodiments. For example, the memory device 1030 includes at least one integrated circuit device obtained by the method of fabricating the integrated circuit device, the method having been described with reference to FIGS. 3 to 10B.

The interface 1040 may be a data transmitting path between the system 1000 and other devices external to the system 1000. The controller 1010, the input/output device 1020, the memory device 1030, and the interface 1040 may communicate with each other through a bus 1050. The system 1000 may be used for mobile phones, MP3 players, navigation systems, portable multimedia players (PMPs), solid state disks (SSDs), or household appliances.

By way of summation and review, when an ultra-fine photoresist pattern having a high aspect ratio is formed in a photolithography process for fabricating semiconductor devices, it is desirable to provide a technique of forming a fine and sophisticated photoresist pattern that has a desired shape while preventing deformation such as bending of the photoresist pattern. Embodiments provide a rinse solution that can be advantageously used in the mass production of an integrated circuit device. The rinse solution is formulated to inhibit bending of photoresist patterns and suppress deformation and collapse of the photoresist patterns to as to prevent a change of critical dimension (CD) of the photoresist patterns caused thereby.

Embodiments also provide a method of fabricating an integrated circuit device by using a rinse solution which can allow photoresist patterns to exhibit excellent CD uniformity by preventing bending of the photoresist patterns, when a process using the photoresist patterns is performed.

The rinse solution according to embodiments includes the surfactant having a chemical structure capable of suppressing penetration into the photoresist pattern. The surfactant includes a compound having a branched structure including a plurality of side chains that have hydrophilicity in order to strongly bond to a hydrophilic group exposed on the sidewall of the photoresist pattern. The hydrophilic groups in the side chains of the surfactant may chemically bond to a plurality of sites of the hydrophilic sidewall of the photoresist pattern. Therefore, when the rinse solution including the surfactant is applied onto the photoresist pattern, the hydrophilic groups in the side chains included in the surfactant can be strongly adsorbed onto the hydrophilic sidewall of the photoresist pattern, and the hydrophobic groups included in the main chain of the surfactant can be kept spaced apart from the photoresist pattern, with the hydrophilic functional groups in the side chains included in the surfactant being between the main chain and the photoresist pattern. Therefore, defects such as bending of the photoresist pattern that could be caused by the surfactant penetrating into, and remaining inside the photoresist pattern in a process of rinsing the photoresist pattern, can be prevented, thereby suppressing deformation and collapse of the photoresist pattern and suppressing a CD change of the photoresist pattern that could be caused by the deformation and collapse. Therefore, the rinse solution according to embodiments is applied to a fabrication process of an integrated circuit device, whereby yield and productivity of the fabrication process of the integrated circuit device may be improved Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of fabricating an integrated circuit device, the method comprising:
forming a photoresist film on a substrate;
exposing the photoresist film to light;
forming a photoresist pattern by developing the photoresist film exposed to light; and
rinsing the photoresist pattern by using a rinse solution that includes a surfactant including a compound having a branched structure, the compound having a branched structure including a hydrophobic group-containing main chain and a plurality of side chains that are branched from the main chain and have at least one hydrophilic functional group, the compound having the branched structure being a compound represented by Formula 1:

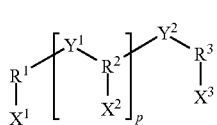

[Formula 1]

wherein each of $X^1$, $X^2$, and $X^3$ is a hydrophilic group;
$R^1$, $R^2$, and $R^3$ are each independently a substituted or unsubstituted C1 to C6 alkyl group-containing group, a substituted or unsubstituted C1 to C6 heteroalkyl group-containing group, a substituted or unsubstituted C2 to C6 alkenyl group-containing group, a substituted or unsubstituted C2 to C6 heteroalkenyl group-containing group, a substituted or unsubstituted C6 to C30 aryl group-containing group, a substituted or unsubstituted C6 to C30 heteroaryl group-containing group, or a substituted or unsubstituted C2 to C20 heteroalkynyl group-containing group;
each of $Y^1$ and $Y^2$ is a C1 to C6 alkoxy group-containing group, a C1 to C6 alkylthio group-containing group, a C1 to C6 alkylcarbonylamino group-containing group, a hydroxyl group-containing group, a C1 to C6 alkyl group-containing group, a halogen atom, a C2 to C6 acyl group-containing group, a C2 to C6 acyloxy group-containing group, a C2 to C6 alkoxycarbonyl group-containing group, a C6 to C30 aryl group-containing group, a cyano group-containing group, or a nitro group-containing group; and
p is an integer of 1 to 2.

2. The method as claimed in claim 1, wherein, in the rinsing of the photoresist pattern, the at least one hydrophilic functional group in the side chains of the surfactant is chemically bonded to a hydrophilic group exposed on a sidewall of the photoresist pattern, whereby the main chain of the surfactant and the photoresist pattern are kept spaced apart from each other, with the at least one hydrophilic functional group in the side chains of the surfactant being between the main chain and the photoresist pattern.

3. The method as claimed in claim 1, wherein each of $X^1$, $X^2$, and $X^3$ includes an anionic hydrophilic group, a cationic hydrophilic group, a nonionic hydrophilic group, or combinations thereof;
$R^1$, $R^2$, and $R^3$ are hydrophobic groups; and
each of $Y^1$ and $Y^2$ is a hydrophobic linkage group.

4. The method as claimed in claim 1, wherein:
the rinse solution includes the surfactant and deionized water, and
the surfactant is present in an amount of 100 ppm to 5,000 ppm in the rinse solution, based on the total amount of the rinse solution.

5. The method as claimed in claim 1, wherein the rinse solution includes:
the surfactant;
deionized water; and
at least one additive selected from among a trimming agent, a dissolution inhibitor, and a dispersant.

6. The method as claimed in claim 5, wherein the additive includes tetrabutylammonium hydroxide (TBAH) as a trimming agent, an amine as a dissolution inhibitor, ammonium hydroxide as dispersant, or combinations thereof.

7. The method as claimed in claim 1, wherein the compound having the branched structure is a compound represented by Formula 2 or 3:

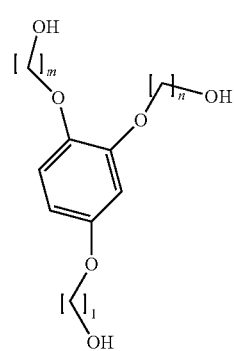

[Formula 2]

wherein in Formula 2, each of l, m, and n is an integer of 1 to 5;

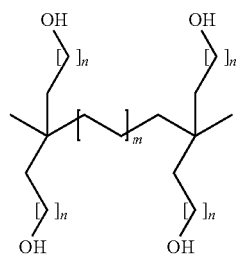

[Formula 3]

wherein in Formula 3, m is 1 or 2, and n is an integer of 1 to 4.

8. The method as claimed in claim 1, wherein the compound having the branched structure is a compound represented by Formula 2 or 3:

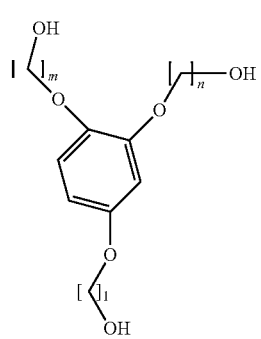

[Formula 2]

wherein in Formula 2, each of l, m, and n is an integer of 1 to 5.

9. A method of fabricating an integrated circuit device, the method comprising:
forming a photoresist film on a substrate;

forming a photoresist pattern having a hydrophilic sidewall by exposing the photoresist film to light and developing the photoresist film;

first-rinsing the photoresist pattern by using deionized water; and second-rinsing the photoresist pattern by applying a rinse solution onto the photoresist pattern, the rinse solution including a surfactant including a compound having a branched structure, the compound having a branched structure including a hydrophobic group-containing main chain and the plurality of side chains that are branched from the main chain and have at least one hydrophilic functional group, the at least one hydrophilic functional group in the plurality of side chains of the surfactant being chemically bondable to a hydrophilic sidewall of the photoresist pattern during the second-rinsing of the photoresist pattern, the compound having a branched structure being a compound represented by Formula 1:

[Formula 1]

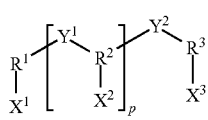

wherein each of $X^1$, $X^2$, and $X^3$ is a hydrophilic group;

$R^1$, $R^2$, and $R^3$ are each independently a substituted or unsubstituted C1 to C6 alkyl group-containing group, a substituted or unsubstituted C1 to C6 heteroalkyl group-containing group, a substituted or unsubstituted C2 to C6 alkenyl group-containing group, a substituted or unsubstituted C2 to C6 heteroalkenyl group-containing group, a substituted or unsubstituted C6 to C30 aryl group-containing group, a substituted or unsubstituted C6 to C30 heteroaryl group-containing group, a substituted or unsubstituted C2 to C20 alkynyl group-containing group, or a substituted or unsubstituted C2 to C20 heteroalkynyl group-containing group;

each of $Y^1$ and $Y^2$ is a C1 to C6 alkoxy group-containing group, a C1 to C6 alkylthio group-containing group, a C1 to C6 alkylcarbonylamino group-containing group, a hydroxyl group-containing group, a C1 to C6 alkyl group-containing group, a halogen atom, a C2 to C6 acyl group-containing group, a C2 to C6 acyloxy group-containing group, a C2 to C6 alkoxycarbonyl group-containing group, a C6 to C30 aryl group-containing group, a cyano group-containing group, or a nitro group-containing group; and p is an integer of 0 to 2.

10. The method as claimed in claim 9, wherein, during the second-rinsing of the photoresist pattern, the main chain of the surfactant and the photoresist pattern are kept spaced apart from each other, with the at least one hydrophilic functional group in the side chains of the surfactant being between the main chain and the photoresist pattern.

11. The method as claimed in claim 9, wherein each of $X^1$, $X^2$, and $X^3$ includes an anionic hydrophilic group, a cationic hydrophilic group, a nonionic hydrophilic group, or combinations thereof, and each of $Y^1$ and $Y^2$ is a hydrophobic linkage group.

12. The method as claimed in claim 9, wherein at least one of $R^1$, $R^2$, and $R^3$ is a fluorine-substituted hydrocarbon group.

13. The method as claimed in claim 9, wherein:

the rinse solution includes the surfactant and deionized water, and the surfactant is present in an amount of 100 ppm to 5000 ppm in the rinse solution, based on the total amount of the rinse solution.

14. The method as claimed in claim 13, wherein the rinse solution further includes at least one additive selected from among a trimming agent, a dissolution inhibitor, and a dispersant.

15. The method as claimed in claim 14, wherein the least one additive includes tetrabutylammonium hydroxide (TBAH), an amine, ammonium hydroxide, or combinations thereof.

16. The method as claimed in claim 9, wherein the compound having the branched structure is a compound represented by Formula 2 or 3:

[Formula 2]

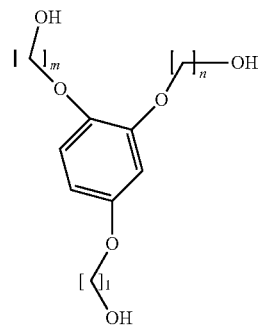

wherein in Formula 2, each of l, m, and n is an integer of 1 to 5;

[Formula 3]

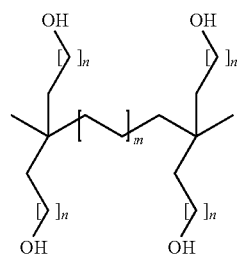

wherein in Formula 3, m is 1 or 2, and n is an integer of 1 to 4.

* * * * *